US012677686B2

(12) United States Patent
Leitgeb et al.

(10) Patent No.: US 12,677,686 B2
(45) Date of Patent: Jul. 7, 2026

(54) ELECTRONIC PACKAGE WITH COMPONENTS MOUNTED AT TWO SIDES OF A LAYER STACK

(71) Applicant: AT&S Austria Technologie & Systemtechnik Aktiengesellschaft, Leoben (AT)

(72) Inventors: Markus Leitgeb, Trofaiach (AT); Martin Schrems, Eggersdorf (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 806 days.

(21) Appl. No.: 17/933,069

(22) Filed: Sep. 16, 2022

(65) Prior Publication Data

US 2023/0092954 A1     Mar. 23, 2023

(30) Foreign Application Priority Data

Sep. 21, 2021     (EP) ..................................... 21198113

(51) Int. Cl.
H01L 23/00 (2006.01)
H10W 20/42 (2026.01)
(Continued)

(52) U.S. Cl.
CPC ......... H10W 70/685 (2026.01); H10W 20/42 (2026.01); H10W 90/00 (2026.01); *H10W 72/967* (2026.01); *H10W 90/297* (2026.01)

(58) Field of Classification Search
None
See application file for complete search history.

(56) References Cited

U.S. PATENT DOCUMENTS

2012/0056329 A1     3/2012  Pagaila et al.
2012/0206407 A1*    8/2012  Taylor ................. G06F 3/04186
                                                          345/174

(Continued)

FOREIGN PATENT DOCUMENTS

CN          209232782 U     8/2019

OTHER PUBLICATIONS

Cortes Rosa, J.; Extended European Search Report in Application EP 21198113.9; pp. 1-10; Mar. 21, 2022, European Patent Office, 80298, Munich, Germany.

*Primary Examiner* — Long Pham
(74) *Attorney, Agent, or Firm* — Robert A. Blaha; Smith Tempel Blaha LLC

(57)                ABSTRACT

A method includes forming a layer stack with at least one electrically insulating layer structure and at least one patterned electrically conductive layer structure on a temporary carrier, the layer stack includes a lower surface adjoining the temporary carrier and an upper surface opposite to the lower surface; mounting a first component at the upper surface; placing a first frame structure at the upper surface, the first frame structure surrounding at least partially the first component; covering the first component with a first coating material, the first coating material spatially extending at least partially into voids at or within the first frame structure and into voids at or within the layer stack; and removing the temporary carrier. The lower surface of the layer stack is an even surface. The opposite upper surface of the layer stack is an uneven surface. An electronic package can be manufactured with the described method.

16 Claims, 11 Drawing Sheets

(51) Int. Cl.
    *H10W 70/685*    (2026.01)
    *H10W 90/00*    (2026.01)
    *H10W 72/90*    (2026.01)
    *H10W 90/20*    (2026.01)

(56)           References Cited

U.S. PATENT DOCUMENTS

| 2012/0286407 | A1 | 11/2012 | Choi et al. | |
|---|---|---|---|---|
| 2014/0048906 | A1* | 2/2014 | Shim | H01L 21/561 |
| | | | | 257/532 |
| 2014/0077361 | A1* | 3/2014 | Lin | H01L 23/5389 |
| | | | | 257/737 |
| 2016/0118333 | A1* | 4/2016 | Lin | H01L 21/6836 |
| | | | | 257/773 |
| 2016/0192525 | A1 | 6/2016 | Hu et al. | |
| 2017/0148755 | A1* | 5/2017 | Scanlan | H01L 24/97 |
| 2019/0148304 | A1 | 5/2019 | Gavagnin et al. | |
| 2020/0075490 | A1* | 3/2020 | Sung | H01L 23/5385 |
| 2020/0212011 | A1 | 7/2020 | Pancholi et al. | |

* cited by examiner

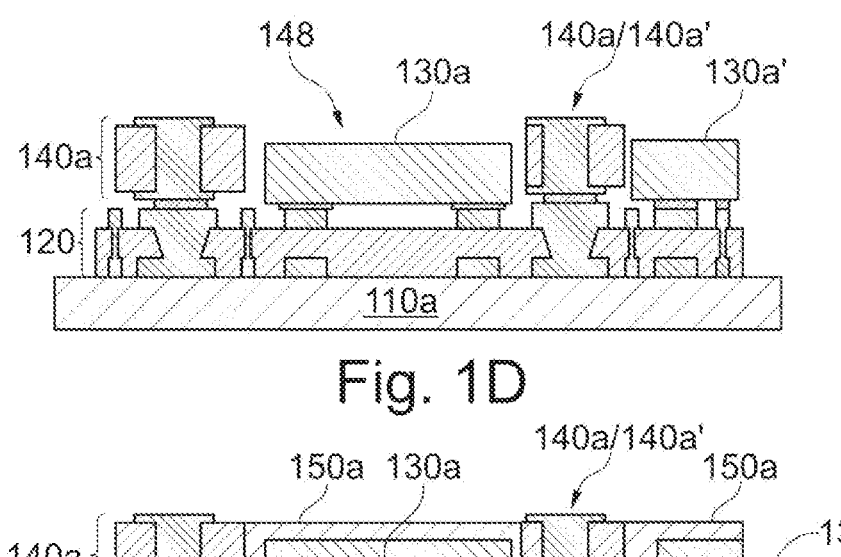
Fig. 1D
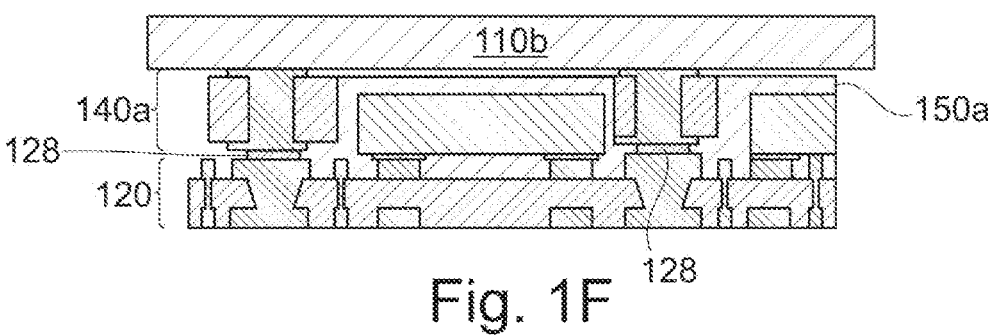
Fig. 1E
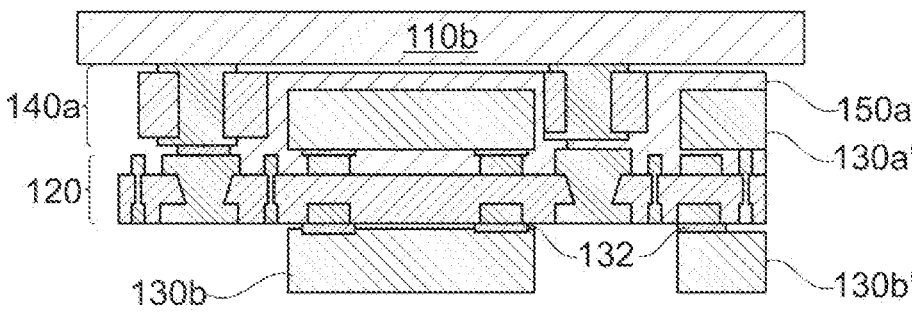
Fig. 1F
Fig. 1G

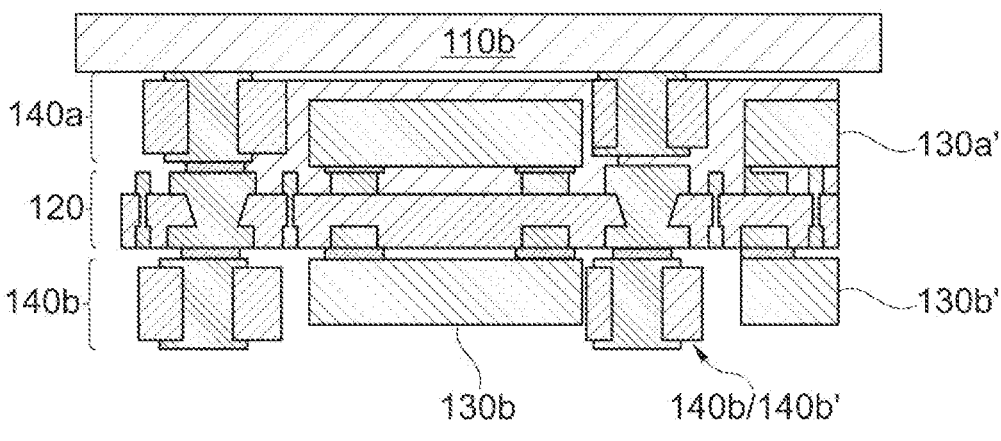
Fig. 1H
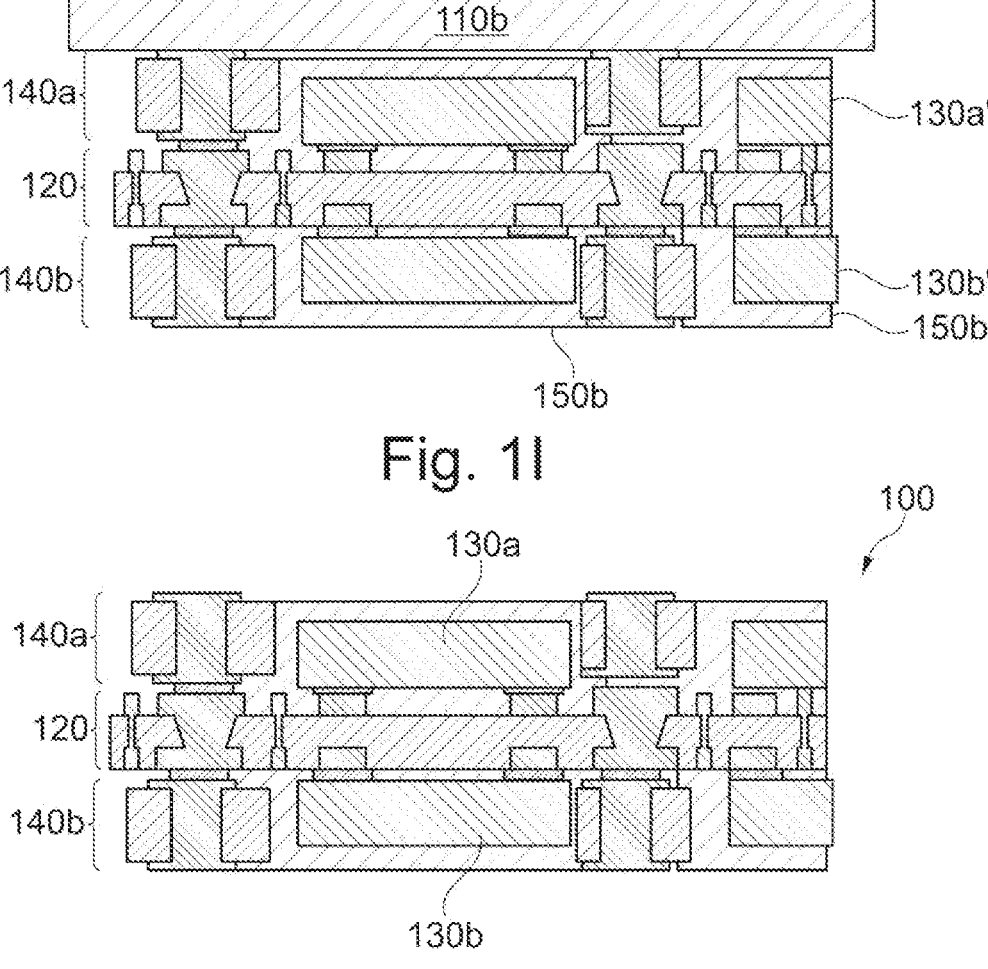
Fig. 1I
Fig. 1J

1

ELECTRONIC PACKAGE WITH COMPONENTS MOUNTED AT TWO SIDES OF A LAYER STACK

CROSS-REFERENCE TO RELATED APPLICATIONS

This application claims the benefit of the filing date of European Patent Application No. 21198113.9, filed Sep. 21, 2021, the disclosure of which is hereby incorporated herein by reference.

TECHNICAL FIELD

Embodiments of the present invention relate to electronic packages where two sides of a layer stack have a mounted component and a method of manufacturing such electronic packages.

BACKGROUND ART

In the field of electronic manufacturing there is a continuous demand to realize increasing product functionalities of electronic assemblies with reduced structural sizes. This demand is met with a continuously increasing miniaturization of electronic assemblies, such as, e.g., small electronic (chip) packages.

Further, in many electronic applications a good High Frequency (HF) compatibility is required. Since each conductor trace makes at least a certain contribution, in particular, for an unwanted overall impedance within a (small) electronic package short electrical connections are needed within such a package. It is known to realize short electrical connections within an electronic package with the concept of double side mounting of electronic components on one and the same substrate which should be as thin as possible. For realizing a thin substrate, a so-called coreless substrate can be employed. This is a substrate which has been manufactured without a precured core.

Thin coreless substrates have the disadvantage that they are mechanically difficult to handle—especially for large size substrates such as for so called System In Packages (SiP) device, e.g., processor/memory modules, Radio-Frequency (RF) modules, modules with chiplets. Further, an unwanted warping of thin coreless substrates is an unwanted issue, in particular, for the manufacturing process of electronic packages. Hence, the production yield of such electronic packages is reduced.

Another approach for realizing small electronic packages with short internal electric connections is the concept of embedding components within (a cavity of) a substrate. However, this concept has the drawback that heat dissipation away from the embedded component is comparatively small. Hence, in order to restrict heat generation such chips can only be operated with a comparatively small process speed. Further, embedding a component requires a significantly higher positioning accuracy than that of a surface mounting of a component.

SUMMARY

There may be a need for a low thickness substrate being suitable for double side (surface) mounting which has a high mechanical stability like for a thicker substrate with core.

This need may be met by the subject matter according to the independent claims. Advantageous embodiments of the present technology are described by the dependent claims.

According to a first aspect there is provided a method for manufacturing an electronic package. The provided electronic package manufacturing method comprises (a) providing a temporary carrier; (b) forming a layer stack comprising at least one electrically insulating layer structure and at least one patterned electrically conductive layer structure on the temporary carrier, wherein the layer stack comprises a lower surface adjoining the temporary carrier and an upper surface opposite to the lower surface; (c) mounting at least one first component at the upper surface of the layer stack; (d) placing and/or bonding a first frame structure at the upper surface of the layer stack, the first frame structure surrounding at least partially the first component; (e) covering the first component with a first coating material, the first coating material spatially extending to the upper surface of the layer stack; and (f) removing the temporary carrier from the layer stack. The lower surface of the layer stack is an even surface and the opposite upper surface of the layer stack is an uneven surface.

Overview of Embodiments

The described electronic package manufacturing method is based on the idea that during all process steps a sufficient mechanical stability can be provided for the layer stack. Hence, without generating or suffering from handling and/or warpage problems the layer stack can be free of a (precured) core. As an alternative or in combination, the layer stack can be very thin, e.g., thinner than 350 μm and preferably thinner than 150 μm.

As can be taken from the sequence of the methods steps the mechanical stability for the layer stack is first provided by the temporary carrier, which may be made from any material which provides the required mechanical stability. Examples for the material of the temporary carrier may be, e.g., a fully cured resin, a reinforced resin, a metal and/or a glass. After the temporary carrier has been removed, the mechanical stability is predominantly provided by the first frame structure. However, also the first component and/or the first filler material can make a (typically minor) contribution to the mechanical stability after the temporary carrier has been removed.

The described temporary carrier may be any structure which provides sufficient mechanical stability for the subsequent process steps which of course include a certain handling in order to control these process steps. In some embodiments the temporary carrier is a component carrier with a core, e.g., a Printed Circuit Board (PCB), or a mechanical plate type structure made from metal and/or glass.

The first component and/or any further component described throughout this document can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example, in a board-in-board configuration. The component may be surface mounted on the component carrier and/or may be embedded in an interior thereof. Moreover, also other components, in particular, those components which generate and emit electromagnetic radiation and/or are sensitive with regard to electromagnetic radiation propagating from an environment, may be used as a component.

The described frame structure may be made from any material which provides sufficient mechanic stability and which can be processed such that a structure surrounding the first component can be formed. The first frame structure may comprise an epoxy resin, in particular, a reinforced epoxy resin. Thereby, the reinforcement particles may be glass spheres or a glass fabric. Depending on the selected material(s) the first frame structure may be formed with a subtractive or any suitable additive manufacturing procedure.

The described first coating material may be any material being suitable for coating the first component in a smooth manner with no or only with small mechanical strain. Specifically, a material with an appropriate Young's modulus may be used. Further, the first filler material may have a Coefficient of Thermal Expansion (CTE) which fits to the CTE's of (i) the first component, (ii) the first frame structure and/or (iii) any other material used for the electronic package. Hence, not only a high mechanical stability but also a high thermal stability of the electronic package can be achieved.

It is pointed out that the step of mounting the first component (and/or any optional further step of mounting a second or a further component) may include an establishing of electric connections between (i) layer stack (vertical) through connections formed at least partially from the at least one patterned electrically conductive layer structure of the layer stack and (ii) terminals of the first component. Thereby, connection pads, which may have potentially been hidden by any electrically non-conductive material, may be opened with any suitable per se known process, such as, e.g., a selective chemical and/or physical etching, a grinding, or a material removal by means of (laser) light radiation. Of course, the same considerations apply for opening connection pads of the layer stack (vertical) through connections which face electric terminals of an optional second component for electrically connecting the second component.

It is mentioned that the formation of the layer stack (vertical) through connections can be realized with any known process, such as, e.g., welding, soldering, applying a sinter paste, and thermal compression bonding.

In some preferred embodiments a necessary opening of the connection pads facing the first component may be realized together with the described removing of the temporary carrier from the layer stack.

In this document the term "even surface" may be understood as a "spatially even surface" or a flat surface in terms of a planarity. The evenness of the surface may directly be related to the before adjoining even or planar surface of the temporary carrier. The even surface may comprise, along the lateral extension (i.e., perpendicular to a vertical z-direction or thickness direction of the layer stack), complementary surface portions of a patterned electrically conductive layer structure and surface portions of the electrically insulating layer structure. This means in other words that along the even surface gaps between elevated portions of the patterned electrically conductive layer structure are filled with dielectric material of the electrically insulating layer structure.

The term "uneven surface" may be understood as a spatially uneven surface wherein depressions of this surface result from surface portions which, with respect to a reference plane, are recessed. Accordingly, there are also elevated surface portions which, with respect to the reference plane, are raised. Such an uneven surface (profile) may be realized for instance by a subtractive process, wherein material being associated with depressed surface portions has been removed by a corresponding patterning process and elevations of this surface result from surface portion which have not been removed by the patterning process. In such a subtractive process the material removal may be realized, e.g., with a chemical etching procedure.

In this context it is mentioned that the described uneven surface may also be realized by means of an additive process, wherein, e.g., elevated copper structures are formed. This means that depressions of the uneven surface result from not being further patterned (by a copper build up process, e.g., plating) and the elevations of the surface result from surface portion which have been patterned by a proper (copper) build up process. It is mentioned that an additive process allows to create thinner copper traces compared to a subtractive process. Hence, for layer stacks with a so called "ultra-high copper density" an additive process is preferred.

It is mentioned that the terms "upper" and "lower" may refer to an initial orientation of the temporary carrier and the layer stack, respectively, of the first component. However, it should be clear that an intermediate structure formed during the described method, which intermediate structure comprises these constituent parts and, if applicable, further constituent parts, may be flipped, in particular by 180°, for instance, in order to facilitate the further processing. This means that in such a flipped orientation "upper" will be a "lower" and "lower" will be "upper".

According to an embodiment the first coating material is a first filler material, which monolithically fills at least partially communicating voids existing between the first component and the first frame structure and which extends into the layer stack. This may provide the advantage that the first component will be embedded in a mechanically reliable manner.

The first filler material may be any material which comprises a certain elasticity, e.g., a viscoelasticity, such that the (at least one) first component will be embedded in a mechanically smooth manner. In this context the first filler material may be for instance an elastic foam type material which makes sure that there is provided enough room for expansion, e.g., in case temperature changes or in case the respective component is a component which during operation expands (e.g., a MEMS component). Just for the sake of clarity it is pointed out that the material examples, which have been described above for the first coating material, also apply for the first filler material. It should be clear that in the context of this document the (first) filler material also represents a (first) coating material.

According to a further embodiment the method further comprises mounting a second component at the lower surface of the layer stack. This may provide the advantage that the integration density and/or the (electronic) functionality of the manufactured electronic package can be increased.

According to a further embodiment the method further comprises placing and/or bonding at least one second frame structure at the lower surface of the layer stack. The second frame structure surrounds least partially the second component. Thereby, the described second frame structure may make a further contribution to the mechanical stability of the electronic package. This holds true, in particular, after the temporary carrier has been removed.

It is mentioned that for the second frame structure the same materials may be used as mentioned above for the first frame structure. The same holds true for the (subtractive or additive) manufacturing procedures as mentioned above. In preferred embodiments the two frame structures are made from the same material(s) and/or are manufactured with the same manufacturing procedure. This may reduce the number of different materials used for the electronic package and the complexity of the manufacturing process. Hence, the described method can be put into practice easily.

According to a further embodiment the method further comprises covering the second component with a second coating material, the first coating material spatially extending to the lower surface of the layer stack; wherein, in particular, the second coating material is a second filler material, with which voids existing between the second component and the second frame structure are filled. This may provide the advantage that the manufactured electronic package may also have a high mechanical and/or thermal stability at its lower portion.

In some embodiments the second coating material is a second filler material, with which voids existing between the second component and the second frame structure are filled.

In preferred embodiments the first coating material or the first filler material is the same as the second coating material or the second filler material, respectively. This means that the resulting electronic package may not only have a structural symmetric configuration but also a symmetric configuration with regard to the used materials. Hence, an unwanted warpage (of the layer stack), e.g., caused by temperature variations, may be reduced.

According to a further embodiment the method further comprises (a), after covering the first component with the first coating material and before mounting the second component, attaching a further temporary carrier at an upper surface of the first component and/or at an upper surface of the first frame structure; and (b), after mounting the second component, removing the further temporary carrier.

The described further temporary carrier may be a structure being similar or being the same as the temporary carrier. This holds true for the geometric structure and/or for the materials used for realizing the further temporary carrier. Specifically, also the further temporary carrier provides sufficient mechanical stability for the subsequent process steps which of course include a certain handling in order to control these process steps.

In some embodiments the further temporary carrier is (individually) the same as the temporary carrier. This means that first the temporary carrier has to be removed before it is attached at the opposing other side as the further temporary carrier. With this approach an advantageous reuse of the temporary carrier is realized.

It is pointed out that it is possible to extend the described electronic package with (further) build-up layer structures. When forming a build-up layer structure at a first outer surface of the electronic package it is clear that before the formation the temporary carrier attached to this first outer surface has to be removed. In some embodiments, another further or the same temporary carrier is then attached to the opposite second outer surface of the electronic package as it is present at this stage of manufacturing the extended electronic package. This approach can be repeated several times such that step by step several (additional) build-up layer structure can be formed alternately at opposite main outer surfaces of the electronic package.

An advantage of using another or the same temporary carrier at the opposite second outer surface of the so far manufactured electronic package may be that the accuracy during manufacturing can be increased. Further, it is mentioned that attaching the component with connection pads phasing down may be preferred because a higher manufacturing accuracy can be achieved.

According to a further embodiment the method further comprises (i) planarizing the upper surface of the first component and the upper surface of the first frame structure and/or (ii) planarizing the lower surface of the second component and the lower surface of the second frame structure.

In this context "planarizing" may mean in particular that the respective upper surfaces are brought to one and the same level with respect to a (vertical) z-direction being perpendicular to the main surface planes of the layers of the layer stack. Planarizing may be realized, e.g., by means of grinding or any other material removal process known in the field of PCB manufacturing. A planarized general or overall surface may provide the advantage that further build-up layers can be formed easily at the respective outer surface. This facilitates a structural and a functional extension of the electronic package with further layers and, if applicable, with further components.

According to a further embodiment the method further comprises (a) mounting at least one further first component at the upper surface of the layer stack; (b) placing and/or bonding the further first frame structure at the upper surface of the layer stack, the further first frame structure surrounding at least partially the further first component; and (c) mounting at least one further second component at the lower surface of the layer stack. In preferred embodiments the method further comprises (d) placing and/or bonding a further second frame structure at the lower surface of the layer stack, the further second frame structure surrounding at least partially the further second component.

Processing the further first component and the further second component in the described manner may provide the advantage that the process of manufacturing two electronic packages can be parallelized. Thereby, it is not necessary to increase the number of simultaneously carried out process steps. Hence, the two electronic packages in a plurality of electronic packages can be manufactured in an effective manner.

Descriptively speaking, the described electronic package with two components mounted on opposite sides of the (thin and coreless) layer stack is manufactured together with at least one further electronic package on a so-called panel level basis, wherein a plurality of electronic packages are formed on or within a large panel (coreless) PCB. After finalizing the formation of the individual electronic packages within the entire PCB panel one or more singularizing procedures must be carried out in order to end up with individual electronic packages, which comprise a desired number of first components and/or second components.

According to a further embodiment, the method further comprises (i) filling voids existing between the further first component and the further first frame structure with the first filler material and/or (ii) filling voids existing between the further second component and the further second frame structure with the second filler material. In preferred embodiments the first filler material and the second filler material are the same or at least comprise the same dielectric material. The described void filling may provide the advantage that a high mechanical and/or thermal stability may be provided along a wide lateral extension. The described void filling may be realized by means of known processes such as, e.g., dispensing, inkjet applying (3D-printing), and laminating.

According to a further aspect there is provided a method for manufacturing at least two individual electronic packages. This multi package manufacturing method comprises (a) carrying out the above described method wherein at least one further first component and at least one further second component is processed and (b) performing at least one singularization process, such that the manufactured electronic package is separated into at least (i) an individual electronic package comprising a portion of the layer stack, the first component, the second component, the first frame structure, and the second frame structure and (ii) a further individual electronic package comprising a further portion of the layer stack, the further first component, the further second component, the further first frame structure, and the further second frame structure.

The described method for manufacturing at least two individual electronic packages is based on the idea that in principle a large number of individual electronic package can be manufactured by parallelizing the (surface) mounting of several components and by parallelizing the placing respectively the forming of several frame structures at one and the same thin (coreless) PCB on a so called panel size level. For singularizing the individual electronic packages usual sawing routines may be employed such as sawing with a mechanical saw and/or laser cutting.

According to a further aspect there is provided an electronic package. The provided electronic package comprises (a) a layer stack comprising at least one electrically insulating layer structure and at least one patterned electrically conductive layer structure forming at least partially a plurality of layer stack through connections extending at least partially from an upper surface of the layer stack to a lower surface of the layer stack, wherein the layer stack through connections are spatially arranged with a layer stack density; (b) at least one first component mounted at the upper surface of the layer stack; and (c) a first frame structure placed at the upper surface of the layer stack, the first frame structure surrounding at least partially the first component, wherein the first frame structure comprises a plurality of first frame through connections extending at least partially through the first frame structure, wherein the first frame through connections are spatially arranged with a first density being smaller than the layer stack (spatial) density. The first component is covered with a first coating material, which spatially extends at least partially into voids at or within the first frame structure as well as into voids at or within the layer stack. Further, the lower surface of the layer stack is an even surface and the opposite upper surface of the layer stack is an uneven surface.

The described electronic package is based on the idea that the first frame structure, which may comprise an epoxy resin, in particular a reinforced epoxy resin, provides enough mechanical stability that the (middle) layer stack can be realized in a coreless manner. As has already been mentioned above, "coreless" may mean in particular that a layer stack is free of a core layer which already during a manufacturing method (and not only at the end of the manufacturing method) is a precured core. Hence, the layer stack and of course also the entire electronic package can be very thin. This may increase the integration density also in a vertical direction, i.e., perpendicular to the main surfaces of the layers of the layer stack.

The layer stack respectively the layer stack through connections may be used to electrically connect at least the first component and/or a second component. Thereby, the first component and/or the second component may have electric terminals which are arranged close to each other and which have, as a consequence, a lateral spacing which is (significantly) smaller than any lateral spacing of electric connection structures which are formed within other portions of the electronic package, in particular within the first frame structure. Hence, the layer stack may represent a so-called Redistribution Layer (RDL) for facilitating an electric connection at least of the first component and/or the second component.

The described electronic package may be suitable for being (surface) mounted at a larger Printed Circuit Board (PCB), e.g., a motherboard. Thereby, the spatial electric connection density between this PCB and the described electronic package may be smaller than the (internal) spatial electric connection density of the first frame through connections.

According to an embodiment the electronic package further comprises an electric interface connecting at least one of the layer stack through connections with at least one of the first frame through connections.

The electric interface may be any electric structure which directly or indirectly connects (i) at least one conductor trace being assigned to a patterned electrically conductive layer structure of the layer stack with (ii) at least one other conductor trace being assigned to a patterned electrically conductive layer structure of the first frame structure. In contrast to prior art connection approaches, the electric connection is not realized with a (metallized) via. Instead, a conductive layer can be used which is arranged in between the layer stack and the first frame structure and which indirectly electrically connects (i) the electrically conductive layer structure of the layer stack with (ii) the electrically conductive layer structure of the first frame structure. This indirect connection can be realized, e.g., by means of solder paste, welding compound, sinter paste or sinter pad.

It is mentioned that there is also the possibility of a direct (electric) connection for instance via thermal compression bonding and/or ultrasonic bonding. In that case there is no need for providing a physical conductive layer arranged in between the layer stack and the first frame structure and the electric interface is not a physical structure but a functional feature provided by (i) the electrically conductive layer structure of the layer stack and/or (ii) the electrically conductive layer structure of the first frame structure.

It is mentioned that the same consideration with regard to the electric connection of the layer stack also apply for a second frame structure which is described below with regard to further embodiments of the electronic package.

According to a further embodiment the electronic package further comprises a second component mounted at the lower surface of the layer stack. The described second (electronic) component may increase the functionality of the electronic package.

According to a further embodiment the electronic package the first component is surrounded by a first filler material forming a first protection layer and a region of the first cavity between the first component and the layer stack is a first void. Alternatively or in combination, the second component is surrounded by a second filler material forming a second protection layer and a region of the second cavity between the second component and the layer stack is a second void.

Descriptively speaking, in this embodiment the two cavities are not (completely) filled with a dielectric material such that there remain unfilled voids. This may provide (at least for same application) the advantage that the first/second component, in case it is an active component which during operation can expand (e.g., a MEMS component and/or a component which during operation exhibits a temperature change), will have enough room for a necessary expansion.

The first/second protection layer may be a comparatively thin protection layer made of either electrically and thermal conductive materials (e.g., copper, graphene) or hydrophobic materials, e.g., polytetrafluoroethylene (PTFE) as a moisture protective layer. Depending on the specific application a proper material for the first/second protection layer can be selected.

In preferred embodiments the first protection layer forms both a part of the layer stack and a part of the first frame structure.

It is pointed out that in this approach the first/second protection layer comprises at least one portion which is assigned both to the layer stack and the respective frame structure. As a consequence, the first/second protection layer does not extend exclusively within a plane parallel to the upper/lower surface of the layer stack but extends (also) along a direction being perpendicular to these surfaces. It is further pointed out that also in this approach it is not necessary that, by contrast to prior art embedding, the respective component has to be placed on a completely flat surface. Instead, also the described first/second protection layer can fill up at least some voids being associated with the non-flatness of the respective surface of the layer stack.

According to a further embodiment, the electronic package further comprises a further layer stack, which is formed (at least partially) at the first frame structure and which comprises at least one further electrically insulating layer structure and at least one further patterned electrically conductive layer structure forming at least partially a plurality of further layer stack through connections extending from an upper surface of the further layer stack to a lower surface of the further layer stack, wherein the further layer stack through connections are spatially arranged with a further layer stack density being higher than the first density.

In this document the described densities, i.e., at least the (further) layer stack density and the first density are geometric properties which relate to the spatial arrangement of the respective (electric) through connections with planes which correspond, or which are parallel to, the main planes respectively the main surfaces of the layers of the layer stack. This means that these planes have a two-dimensional extension which is parallel to the planar extension to the layers of the layer stack.

It is mentioned that it is not required that the described densities are spatially constant within the regions where they are established. Specifically, the spacing between two (neighboring) individual (vertical) through connections may be different than the spacing between two other (neighboring) individual (vertical) through connections. However also for not equidistantly arranged through connections there exists of course an average (spatial) density. Hence, in the context of this document the term "density" may also mean "average density".

It is mentioned that the further layer stack may also form a redistribution layer (RDL) for the first component and/or for any other component mounted at this further layer stack. The (average) density of the further layer stack through connections may be the same as or may be different from the (average) density of the layer stack through connections. However, both layer stack through connections are arranged with a higher (spatial) density than the first frame through connections.

According to a further embodiment the electronic package further comprises at least one third component mounted at the first frame structure and being electrically connected with the first frame through connections. This may provide the advantage that the electronic package can on the one hand be provided with a high degree of functionality and on the other hand in a spatially compact design. In this context it should be recognized that in this embodiment the first frame structure not only serves as a mechanical structure for increasing the stability of the electronic package during manufacturing but also serves for providing an appropriate electric connection for the third component by means of the first frame through connections.

In some embodiments, the third component is mounted at the further layer stack in such a manner that the further layer stack is located in between the first component and the third component.

The described third component may be any component which may increase the functionality of the electronic package. The (spatial) density of the terminals of the third component may be typically lower such that it can be electrically connected with the first frame through connections which, as specified above, have a comparatively low (spatial) density.

According to an embodiment the electronic package further comprises a second frame structure placed at the lower surface of the layer stack, the second frame structure surrounding at least partially the second component. The second frame structure comprises a plurality of second frame through connections extending at least partially through the second frame structure. The second frame through connections are spatially arranged with a second density being smaller than the layer stack (spatial) density. Alternatively or in combination, the second component is accommodated within a second cavity formed at least partially by the second frame structure, wherein voids existing within the second cavity are filled at least partially and preferably completely with a second filler material. Preferably, the second filler material forms both a part of the layer stack and a part of the second frame structure.

The described second frame structure may provide the advantage that the mechanical stability of the electronic package will be increased. In particular, the second frame structure may specifically protect the second component. Hence, the operational reliability of the entire electronic package will be improved.

The second frame structure may be made from the same materials and/or may comprise the same thickness as compared to the first frame structure. In case the first component and the second component have the same lateral dimensions not only the thickness but also the entire lateral dimensions of the two frame structures may be the same.

The first/second filler material may mechanically protect the first/second component such that a high reliability of the described electronic package (even under rough environmental conditions) can be achieved. Further, since a (dielectric) filler material usually comprises a low thermal conductivity, the respective embedded component can be protected from the high temperatures of the environment. This may be of advantage, in particular, in embodiments where the embedded component is an electrically passive component.

In preferred applications the first filler material forms both a part of the layer stack and a part of the first frame structure. Alternatively or in combination, the second filler material forms both a part of the layer stack and a part of the second frame structure. It is pointed out that this approach where the filler material is assigned both to the layer stack and the respective frame structure is completely different to prior art embedding of components where the respective component has to be placed on a completely flat or even surface. In this approach, the respective surface of the layer stack may not be flat or even but uneven, e.g., because of a spatial patterning, e.g., because of a corresponding patterning of the electrically conductive layer structure of the stack. Voids being associated with the non-flatness of the respective surface of the layer stack will be filled with the respective filling material which results in a reliable embedding of the respective component at all geometric sides.

According to a further embodiment the layer stack through connections and/or the further layer stack through connections have a line spacing being smaller than 8 μm ($=8\times10^{-6}$ m) and the first frame through connections are arranged with a line spacing larger than 15 μm ($=15\times10^{-6}$ m) and in particular, larger than 25 μm ($=25\times10^{-6}$ m).

In further embodiments the electrically insulating layer of the layer stack and optionally further electrically insulating layer structures comprise or are made from at least one of the following materials: polyimide (PI); polyamide; poly(p-phenylene-2,6-benzobisoxazole) (PBO); a polymer of Benzocyclobutan (BCB); a polymer of Phenol; Ajinomoto Build-up Film (ABF); non-reinforced resin, for instance epoxy resin or bismaleimide-triazine resin cyanate ester resin; polyphenylene derivate; liquid crystal polymer (LCP), epoxy-based build-up film; PTFE; a photoimageable dielectric material. In particular for high frequency applications, high-frequency materials such as PTFE, liquid crystal polymer and/or cyanate ester resins, low temperature cofired ceramics (LTCC) or other low, very low or ultra-low DK materials may be implemented as electrically insulating layer structure(s).

All these electrically insulating materials have a high tensile strength, a low Young's modulus and an excellent thermal stability respective a good heat resistance. Hence, they may provide a comparatively large contribution to a high mechanical and thermal stability of the described electronic package. This may hold true not only during operation but also during manufacturing of the electronic package.

In particular the mentioned ABF may provide the advantage that it comprises a low coefficient of thermal expansion (CTE), a low Young's modulus, a low dielectric loss factor (Df), a low water absorption, and a good reliability in biased Highly Accelerated Stress Testing (HAST). In this context a further advantage of the ABF may be a low migration behavior and a low galvanic/electric corrosion.

In further embodiments also the first frame structure and/or the second frame structure comprises or is made from at least one of the above-mentioned material for the electrically insulating layer.

Glass particles, which may be used for reinforcing the epoxy resin, may be for instance glass spheres. However, also (common) glass fibers may be employed.

In some embodiments (i) the first frame structure has the same thickness or is thicker than and the first component. Alternatively or in combination, the second frame structure has the same thickness or is thicker than and the second component. This means that the first/second frame structure is at least as thick as the respective first/second component. If component and frame structure have the same thickness, there is automatically provided the advantage of a common surface plane at the upper surface of the first frame structure and the first component. This facilitates for further expanding the described electronic package with further (functional) layers as an upper build-up structure. In case the first/second component is thinner than the respective frame structure this difference in height can be compensated by means of the above-described filler or coating material, with which the void is filled up (exactly) to the level of the frame structure.

In this context it is mentioned that a build-up structure may be any layer structure, in particular laminated layer structure, which expands the electronic package along a height or thickness direction. The functionality of a layer may be for instance by a further embedded components and/or by conductive portions of an electrical connection structure, e.g., a so-called redistribution layer structure.

In some embodiments the upper build-up structure and/or also a potentially existing lower build-up structure may comprise thermally conductive materials or coatings. Such "build-up structure materials" may allow for an improved heat management of the entire electronic assembly, in particular, when in operation.

In accordance with the usual coordinate systems used for described build-up layer structures the thickness is measured along a direction being perpendicular to the main surface planes of the various layers.

In some embodiments the layer stack is thinner than the first frame structure. Alternatively or in combination, the layer stack is thinner than the second frame structure. This may mean that by far the biggest contribution to the mechanical stability of the electronic package is given by the frame structure(s). This may provide the advantage that the thickness of the layer stack can be further reduced such that the length of electric connections between the first component and the second component can be minimized. As has already mentioned above this may result in an outstanding HF behavior of the electronic package.

In some embodiments at least some of the layer stack through connections are electrically connected with at least some of the first frame through connections. Alternatively or in combination, at least some of the layer stack through connections are electrically connected with at least some of the second frame through connections. This may provide the advantage that also vertical electric connections can be provided, which surround and/or which bypass the first component and/or the second component. Hence, the wiring density within the electronic package can be increased and a large freedom of design may be given for electrically connecting at least one further component being located within a build-up layer structure formed above the first component respectively the first frame structure or below the second component respectively the second frame structure.

It is pointed out that the described frame through connections could be either formed by, e.g., mechanical drilling or laser drilling. Depending on the employed drilling procedure the shape of these frame through connections can be either straight (mechanical drilling) or tapered (laser drilling). Hence, the shape of the frame through connections is indicative for the used drilling method.

According to a further embodiment the electronic package further comprises a first build-up structure formed above the first component and the first frame structure. Alternatively or in combination, the electronic package further comprises a second build-up structure formed below the second component and the second frame structure.

With each one of the described (additional) build-up structures further functionality may be provided to the electronic package. Thereby, each build-up structure may comprise any appropriate sequence of at least one electrically insulating layer structure and at least one (patterned) electrically conductive layer structure. Further, also further components may be embedded within the respective build-up structure, if applicable surrounded by respectively a frame structure and optionally with an appropriate filler material for filling voids.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims and features of the apparatus type claims is considered as to be disclosed with this document.

In the following there will be given additional technical information in to obtain a better understanding of the technology described in this document.

A "component carrier", which may be used as the temporary carrier, may particularly denote any support structure which is capable of accommodating directly or indirectly via other (layer) structures one or more components thereon for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In accordance with the layer stack of the described electronic package also a component carrier may comprise a stack of at least one electrically insulating layer structure and at least one electrically conductive layer structure. For example, the component carrier may be a laminate of electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane. The component carrier may be shaped as a plate. Further, the component carrier may be configured as one of the group consisting of a Printed Circuit Board (PCB), a substrate (in particular an IC substrate), and an interposer.

A component carrier may be a laminate-type component carrier. In such an embodiment, the component carrier is a compound of multiple layer structures which are stacked and connected together by applying a pressing force and/or heat.

In the context of this document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular, copper), thereby forming vias as through-hole connections. Apart from one or more components which may be embedded in a printed circuit board, a printed circuit board is usually configured for accommodating one or more components on one or both opposing surfaces of the plate-shaped printed circuit board. Such components may be connected to the respective main surface by soldering. A dielectric part of a PCB may be composed of resin with reinforcing fibers (such as glass fibers).

In the context of this document, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular, an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

The electrically insulating layer structure(s) used for realizing embodiments of the invention described in this document may comprise at least one of the group consisting of resin (such as reinforced or non-reinforced resins, for instance epoxy resin or bismaleimide-triazine resin), cyanate ester resin, polyphenylene derivate (such as alkylate polyphenylene-ether (aPPE)), glass (in particular glass fibers, multi-layer glass, glass-like materials), prepreg material (such as FR-4 or FR-5), polyimide, polyamide, liquid crystal polymer (LCP), epoxy-based build-up film, PTFE, a ceramic, and a metal oxide. Reinforcing structures such as webs, fibers or spheres, for example made of glass (multi-layer glass) may be used as well. Although prepreg particularly FR4 are usually preferred for rigid PCBs, other materials in particular epoxy-based build-up film or photoimageable dielectric material may be used as well. For high frequency applications, high-frequency materials such as PTFE, liquid crystal polymer and/or cyanate ester resins, low temperature cofired ceramics (LTCC) or other low, very low or ultra-low DK materials may be implemented in the component carrier as electrically insulating layer structure.

The patterned electrically conductive layer structures used for realizing embodiments of the invention described in this document may comprise at least one of the group consisting of copper, aluminum, nickel, silver, gold, palladium, and tungsten. Although copper is usually preferred, other materials or coated versions thereof are possible as well, in particular, materials coated with supra-conductive material such as graphene.

It is possible to apply a surface finish selectively to exposed electrically conductive surface portions of the layer stack, a potential build-up layer and/or any component carrier of the described electronic package. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular, copper circuitry) and enable a joining process with one or more components, for instance by soldering. Examples for appropriate materials for a surface finish are Organic Solderability Preservative (OSP), Electroless Nickel Immersion Gold (ENIG), gold (in particular, Hard Gold), chemical tin, nickel-gold, nickel-palladium, ENIPIG (Electroless Nickel Immersion Palladium Immersion Gold, etc.

The aspects defined above and further aspects of the present technology are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L, FIG. 1M, and FIG. 1N show intermediate products resulting from various production steps when manufacturing an electronic package in accordance with embodiments of the invention.

Figures 1A, 1B, 1C:
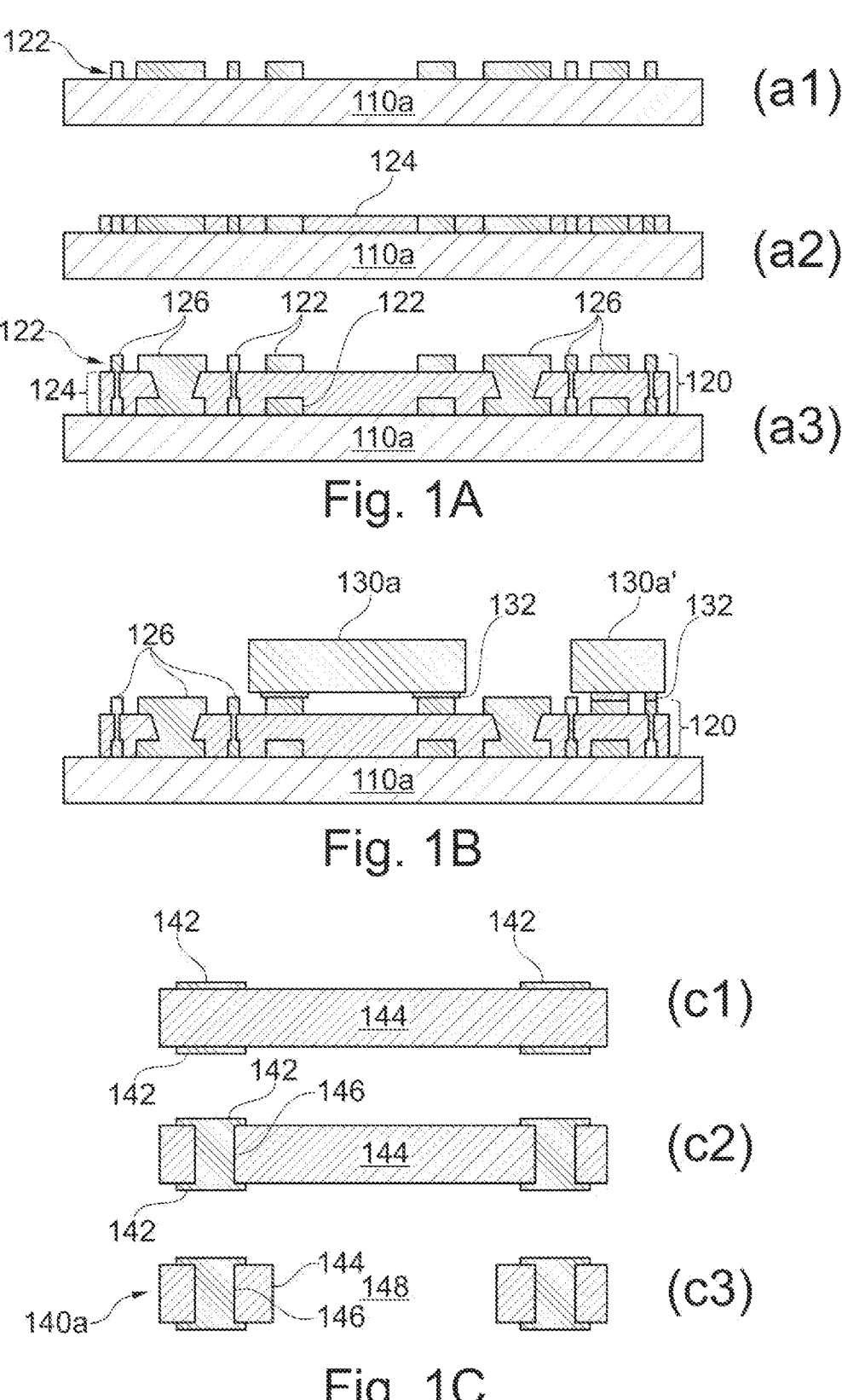

DETAILED DESCRIPTION OF ILLUSTRATED
EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element(s) as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment of the invention can assume orientations different than those illustrated in the Figures when in use.

Figure 1K:
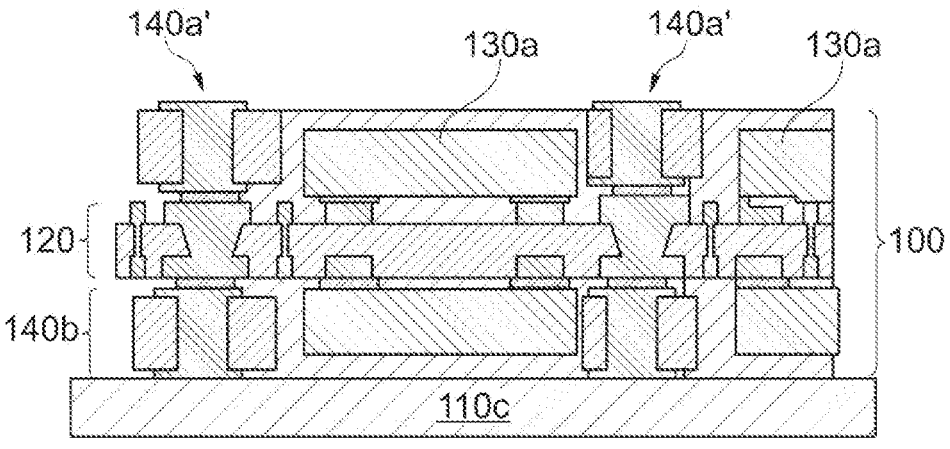
Figure 1L:
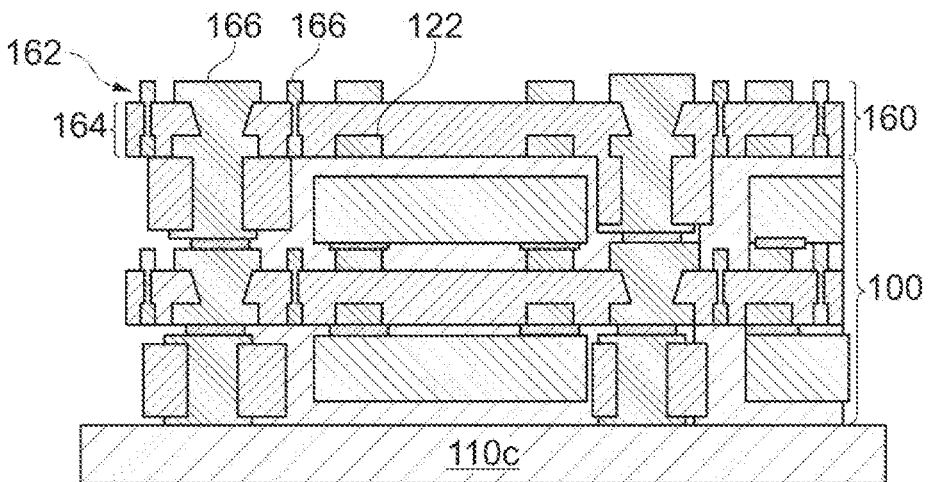
Figure 1M:
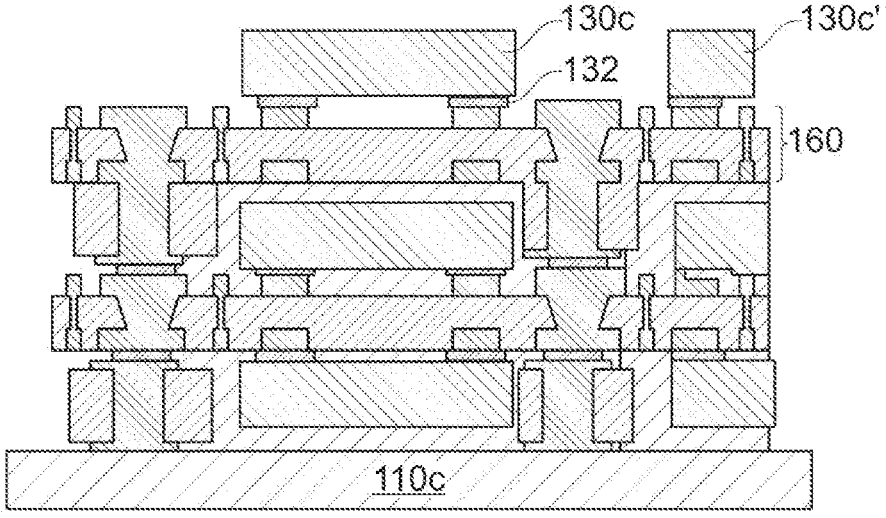
Figure 1N:
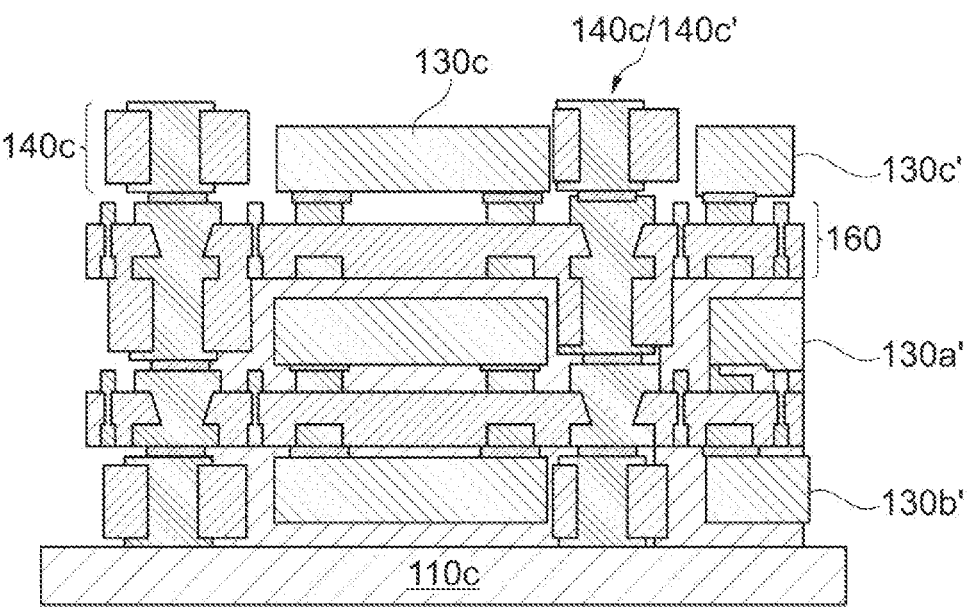

FIG. 1A to FIG. 1N illustrate a method for manufacturing an electronic package in accordance with embodiments of the invention. The illustration comprises several intermediate products resulting from various manufacturing steps of the manufacturing method.

As can be taken from FIG. 1A, the method starts with providing a temporary carrier 110a. According to the embodiment described here the temporary carrier 110a is a comparatively stiff structure made from a fully cured resin which may be reinforced, e.g., with glass fiber pieces. In other embodiments the temporary carrier may be a glass plate, a ceramic plate, a metal sheet, a composite material or any material which has appropriate physical properties. On an upper (even) surface of the temporary carrier 110a there is formed an electrically conductive layer structure 122. This structure 122, which is very thin, e.g., only 1 nm, can be formed either by physical deposition (e.g., physical vapor deposition) or chemical deposition (e.g., electroless plating). Further, this structure 122 is patterned such that a plurality of connection pads and/or conductor traces are formed. In FIG. 1A the resulting structure is denominated with "(a1)".

Next, an electrically insulating layer structure 124 is formed on the upper surface of the temporary carrier 110a in between the patterned pieces of the electrically conductive layer structure 122. The result is denominated with "(a2)".

In next per se known process steps there are formed additional electrically insulating layer structures and electrically conductive layer structures resulting in a layer stack 120. As can be taken from the bottom image of FIG. 1A, the layer stack 120 comprises at least two electrically insulating layer structures 124 and at least two patterned electrically conductive layer structures 122. Further, at least some of the conductive pieces of the lower electrically conductive layer structure 122 are electrically connected with respectively at least one conductive piece of the upper electrically conductive layer structures 122 by means of a vertical interconnection element, e.g., a metallized via. In this document these vertical interconnection elements are denominated layer stack through connections 126. The result is denominated in FIG. 1A with "(a3)".

Within a main surface of the layer stack 120 the layer stack through connections 126 are spatially arranged close to each other, e.g., with an (average) Fine Line Spacing (FLS) of less than 10 μm. Hence, the (average) integration density of the layer stack through connections 126 within a (horizontal) plane being parallel to the main surface of the layer stack 120 is comparatively high.

FIG. 1B shows the result of a next process step, wherein a first component 130a is surface mounted at the upper surface of the layer stack 120. Thereby, terminals 132 of the first component 130*a* are electrically connected with predefined connection pads of the upper patterned electrically conductive layer structure 122 of the layer stack 120.

According to the embodiment described here together with the first component 130*a* there is (surface) mounted a further first component 130*a'* at the upper surface of the layer stack 120. Thereby, the first component 130*a* and the further first component 130*a'* are placed next to each other with a certain spacing in between. Also, the further first component 130*a'* is electrically connected in an appropriate manner with the upper patterned electrically conductive layer structure 122. In FIG. 1B and also in the following FIG. 1D through to FIG. 1N only a portion of the further first component 130*a'* is shown.

FIG. 1C illustrates the fabrication of a first frame structure 140*a* which is later used for further processing the structure shown in FIG. 1B. As can be seen from the upper figure portion "(c1)", an insulating layer 144, e.g., a prepreg material, is provided with two patterned electrically conductive layers 142 formed at the upper respectively at the lower surface of the insulating layer 144.

It is mentioned that the insulating layer 144 may also be or comprise a stack including (copper) conductor structures. However, as mentioned already above, compared to layer stack 120 the conductor density is lower.

As can be seen from the middle figure portion "(c2)", a first frame through connections 146 are formed in between two conductive pieces, one of the upper electrically conductive layer 142 and the other one from the lower electrically conductive layer 142.

Next, as can be taken from the lower figure portion "(c3)", an opening 148 is formed within an insulating layer 144. This can be done, e.g., by means of laser cutting or any appropriate etching process, wherein a proper mask is applied in order to realize a spatially selective etching.

FIG. 1D shows the result of the next process step, wherein the first frame structure 140*a* is assembled at the layer stack 120. This is done in such a manner that the first component 130*a* is located within the opening 148. Further, although not shown in the image section of FIG. 1C, the layer stack structure forming the first frame structure 140*a* is further provided with a second opening. This second opening geometrically fits to the size and the position of the further first component 130*a'* shown in FIG. 1B. Hence, the portions of the layer stack structure which, after assembling, surround the further first component 130*a'*, are denominated in this document a further first frame structure 140*a'*.

As can be taken from FIG. 1D, there is provided an electric interface 128 between a via of the layer stack and a via of the first frame structure 140*a*. According to the exemplary embodiment described here this electric interface is a physical structure realized by (a portion of) a conductive layer. This conductive layer can be realized, e.g., by means of a solder paste, a welding compound, a sinter paste, etc. Hence, the mentioned two vias are indirectly connected with each other.

FIG. 1E shows the result of the next process step, wherein voids existing between the first component 130*a* and the first frame structure 140*a* and also voids existing between the further first component 130*a'* and the further first frame structure 140*a'* are filled with a first filler material 150*a*. It is mentioned that the first filler material 150*a* (and other filler materials described in this document) are dielectric materials. Further, as has already been mentioned above, the (dielectric) first filler material 150*a* may be any material being suitable for embedding the first component 130*a* and the further first component 130*a'* in a mechanically smooth manner, i.e., with no or only with small mechanical strain even under varying temperature conditions.

Next, as can be seen from FIG. 1F, according to the exemplary embodiment described here, the temporary carrier 100*a* is removed and a further temporary carrier 110*b* is attached at the other side of the so far manufactured structure comprising the layer stack 120, the first components 130*a*, 130*a'*, and the first frame structures 140*a*, 140*a'*. Typically, the further temporary carrier 110*b* is identical in construction with the temporary carrier 110*a*. However, in order to reduce waste, the temporary carrier 110*a* can be reused as the further temporary carrier 110*b*.

It is pointed out that in reality the so far manufactured structure is flipped by 180° such that the further temporary carrier 110*b* is again located at the bottom. Thereby, the following manufacturing steps can be carried out (with the help of gravity) much easier. However, for these, ease of illustration, such a beneficial flipping is not shown here.

FIG. 1G shows the result of the next process step, wherein a second component 130*b* and a further second component 130*b'* are surface mounted at the layer stack 120. Again, care is taken for a correct electric connection of all the connection terminals 132 of the second components 130*b*, 130*b'*. As a result, the first components 130*a*, 130*a'* are mounted at one main surface of the layer stack 120 and the second components 130*b*, 130*b'* are mounted at the opposing other main surface of the layer stack 120.

FIG. 1H shows the result of the next process step, wherein a second frame structure 140*b* and (simultaneously) a further second frame structure 140*b'* are assembled at the layer stack 120. This is done in such a manner that the second component 130*b* is surrounded by the second frame structure 140*b* and the further second component 130*b'* is surrounded by the further second frame structure 140*b'*.

FIG. 1I shows the result of the next process step wherein voids existing between the second component 130*b* and the second frame structure 140*b* and voids existing between the further second component 130*b'* and the further second frame structure 140*b'* are filled with a second filler material 150*b*. According to the embodiment described here the second filler material 150*b* is the same as the first filler material 150*a*. In other embodiments, the second filler material may be different from the first filler material. However, both filler materials are dielectric materials.

Next, as can be taken from FIG. 1J, the further temporary carrier 110*b* is removed. The now provided structure is probably the simplest configuration of an electronic package 100 in accordance with embodiments of the invention.

Next, as can be taken from FIG. 1K, there is attached a temporary carrier to one main surface of the electronic package 100. This temporary carrier, which can be a new or a reused temporary carrier, is denominated with reference numeral 110*c*. Also, the temporary carrier 110*c* is used for providing a mechanical stability during the further manufacturing steps.

Next, as can be taken from FIG. 1L, there is formed a further layer stack 160 at the upper surface of the first components 130*a*, 130*a'* and the first frame structures 140*a*, 140*a'*. In accordance with the layer stack 120 also the layer stack 160 comprises at least one electrically insulating layer structure 164, at least one patterned electrically conductive layer structure 162, and several layer stack through connections 166, which according to the embodiment described here are spatially arranged with a high density respectively with a small FLS of less than 10 µm.

FIG. 1M shows the result of the next process step, wherein a third component 130c and a further third component 130c' are surface mounted at the layer stack 160. Again, care is taken for a correct electric connection of all the connection terminals 132 of the third components 130c, 130c'.

FIG. 1N shows the result of the next process step, wherein a third frame structure 140c and (simultaneously) a further third frame structure 140c' are assembled at the further layer stack 160. This is also done in such a manner that the third component 130c is surrounded by the third frame structure 140c and the further third component 130c' is surrounded by the further third frame structure 140c'. Thereby, the third frame structures 140c, 140c' and the accommodated third components 130c, 130c' can be seen as to represent a functional build-up for the electronic package 100 shown in FIG. 1J.

It is mentioned that of course the voids around the third components 130c, 130c' which can be seen in FIG. 1N can filled with an appropriate filler material. Since such a process, which is often also called "underfilling", is per se well known to the skilled person, no further details are elucidated here in this context.

An important aspect of the embodiment described here is that structure of the temporary carrier 110a shown already in FIG. 1A gives the necessary rigidity for the following build up layers shown in the following Figures. At least one component, here the first component 130a, is assembled (face down) on top of the first build up, here the layer stack 120. Afterwards, voids are at least partially filled by means of a per se known lamination process (see FIG. 1E). This void filling lamination increases the mechanical stability of the layer stack 120 to such an extent that it has enough rigidity such that and the temporary support structure could be removed without suffering from unwanted deformation or warpage. With this approach much thinner layer stacks can be used as compared to know processes, which required a comparatively thick (cured) core structure. The stack 120 could be e.g., a very thin so called ultra-high-density layer (UHDL). Moreover, also the frame structures 140 may consist of or may comprise high density layers, but the density of the (copper) conductor traces inside the layers of the frame structure may be smaller as compared to respective density within the layer stack 120.

Figure 2A:
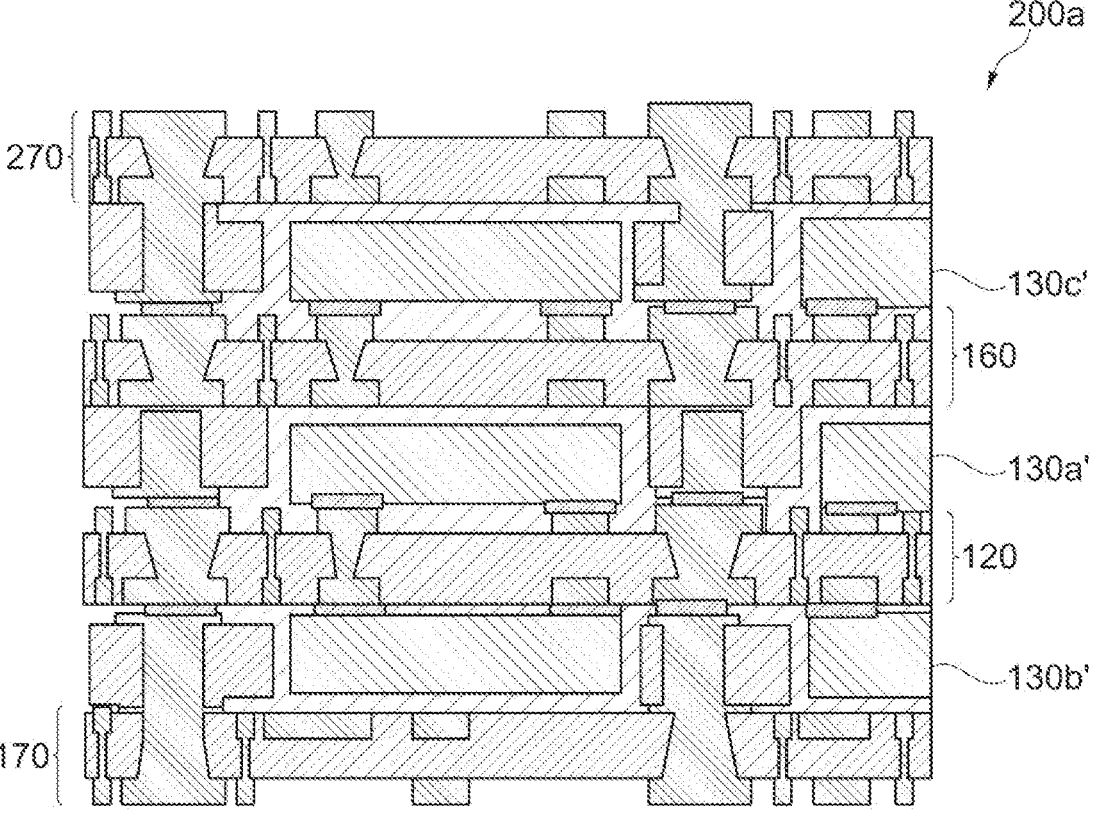
FIG. 2A, FIG. 2B, and FIG. 2C show a stacked electronic package, a singularized stacked electronic package, and a shielded singularized stacked electronic package, respectively.
Figure 2B:
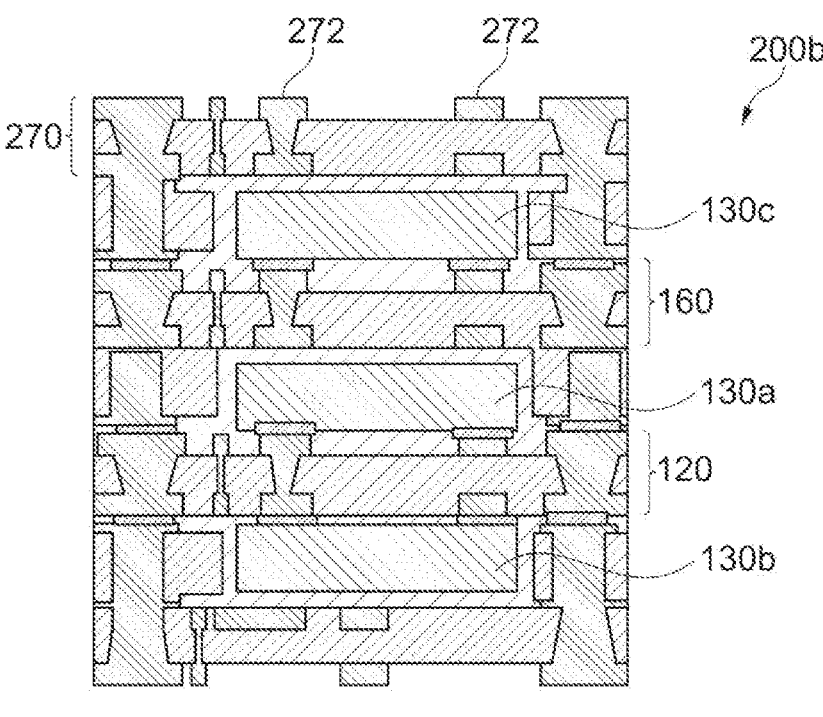
Figure 2C:
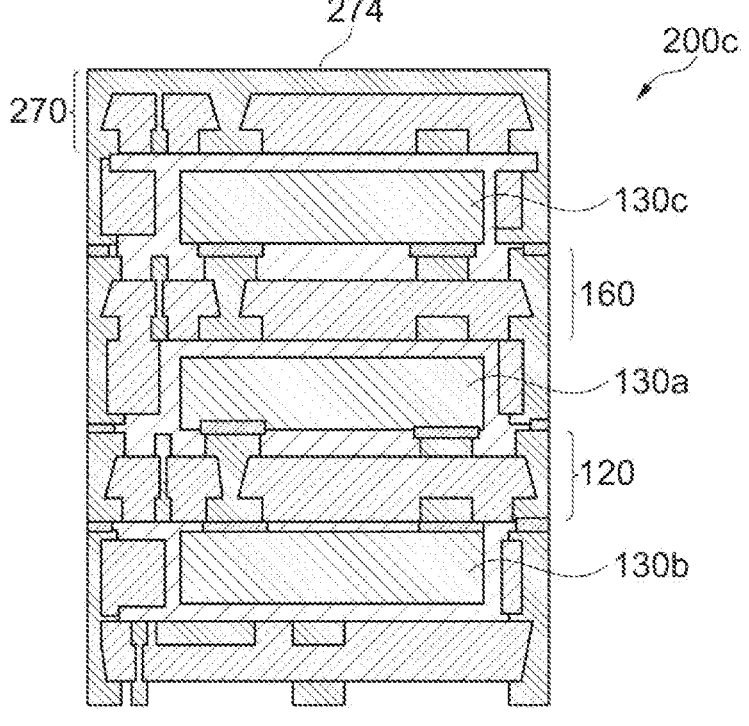

FIG. 2A, FIG. 2B, and FIG. 2C show stacked electronic packages according to various embodiments of the invention which result from a further processing of the structure shown in FIG. 1N.

FIG. 2A shows a stacked electronic package 200a according to one embodiment of the invention. As can be taken from a comparison with FIG. 1N, the stacked electronic package 200a it is a product resulting from the structure of FIG. 1N with basically straightforward further processing steps. Specifically, the voids between the third components 130c, 130c' and the surrounding third frame structures 140c, 140c' are filled with a (third) filler material. According to the embodiment described here this (third) filler material is the same as first filler material 150a and the second filler material 150b. As mentioned above, in other embodiments different filler materials can be used. Further, an additional layer stack 270 having at least substantially the same or a similar structure as the other layer stacks 120 and 160 are formed on top of the third components 130c, 130c' respectively the third frame structures 140c, 140c'.

FIG. 2B shows a singularized stacked electronic package 200b. From comparison with the structure shown in FIG. 2A it can be easily seen that singularized stacked electronic package 200b can be produced from the stacked electronic package 200a with a usual singularization procedure, e.g., a mechanical sawing of a separation with sufficiently intense laser radiation.

In the electronic package 200b the upper connection pads 272 may be used for electrically connecting the third component 130c with external circuitry. However, in some embodiments where the third component 130c is a Radio Frequency (RF) component, these pads are used as antenna elements 272.

FIG. 2C shows a shielded singularized stacked electronic package 200c. An electromagnetic shielding is achieved by forming/providing an upper shielding layer 274 at the top. A "lateral shielding" is achieved by selecting an appropriate position for singularization cuts. Specifically, the singularization has been carried out by cutting at a position where fully metalized vias are vertically stacked inline over each other. Hence, at least within the regions of these stacked fully metalized vias a shielding can be achieved in a simple and effective manner.

Figure 3:
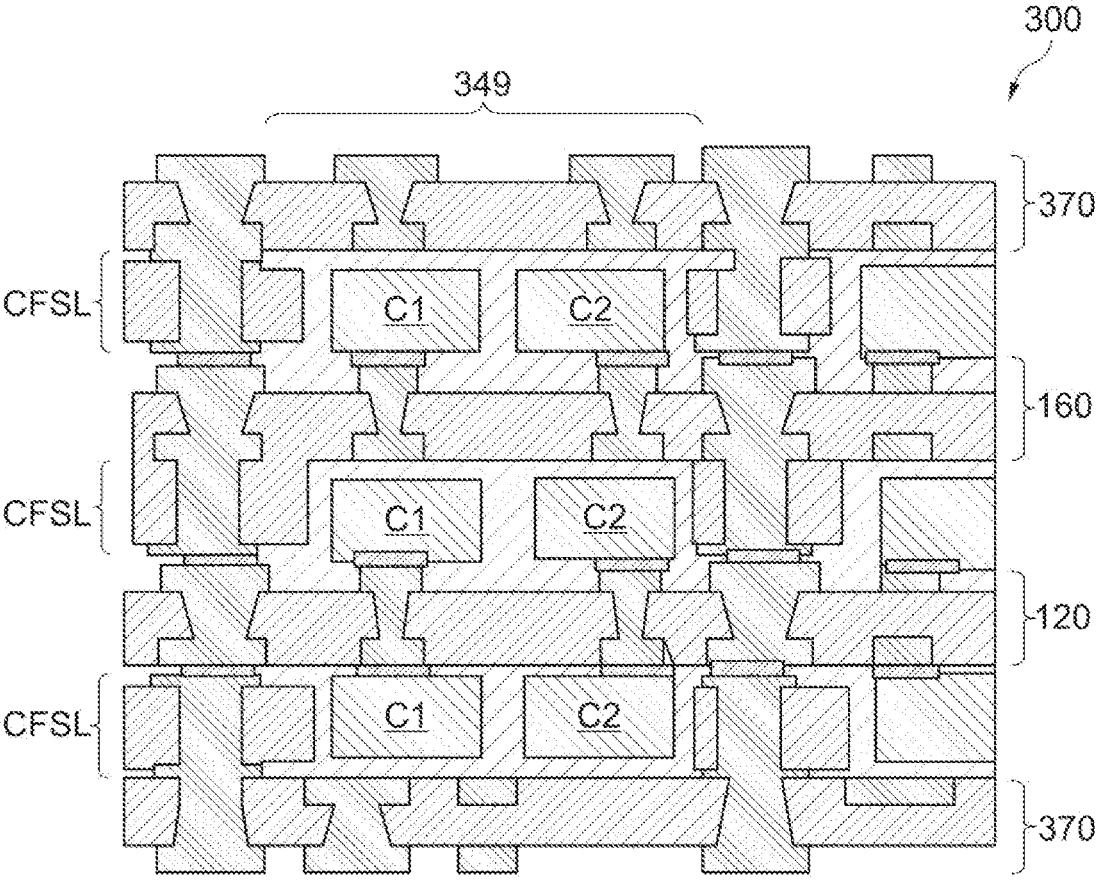
FIG. 3 shows a stacked electronic package wherein respectively two components are surrounded by one and the same frame structure.

FIG. 3 shows a stacked electronic package 300 wherein respectively two components are surrounded by one and the same frame structure. Specifically, within an inner frame region 349 (and other inner frame regions not shown in the image section of FIG. 3) there are, within each "component and frame structure layer" CFSL, respectively two components C1 and C2 surrounded by one and the same frame structure. In a vertical direction, (i) the upper two components C1 and C2 are sandwiched between an upper additional layer stack 370 and the further layer stack 160, (ii) the middle two components C1 and C2 are sandwiched between the further layer stack 160 and the layer stack 120, and (iii) the lower two components C1 and C2 are sandwiched between the layer stack 120 and a lower additional layer stack 370.

Figure 4A:
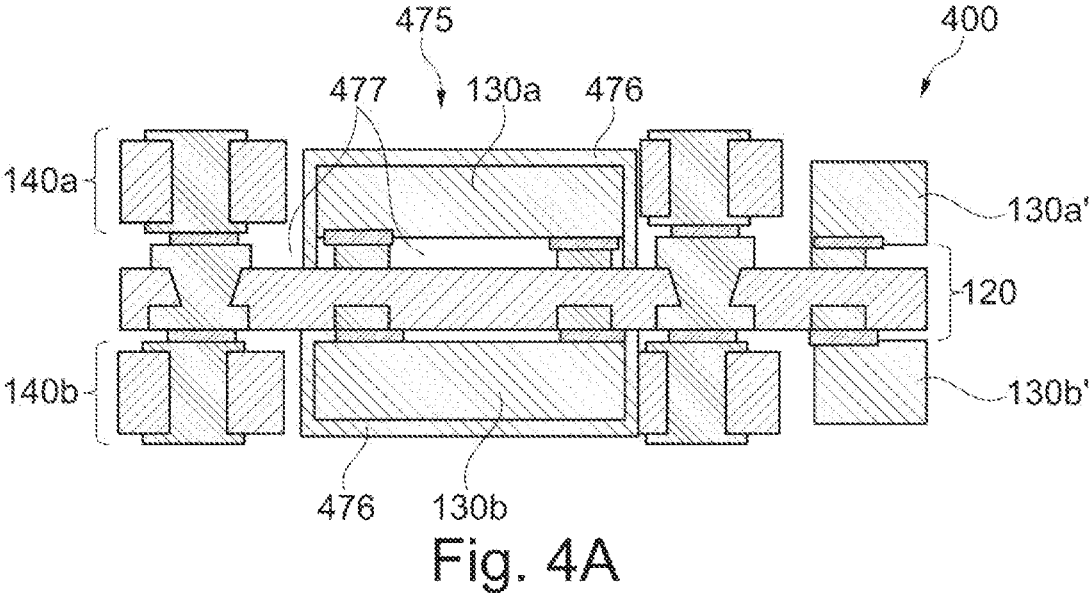
FIG. 4A and FIG. 4B show electronic packages wherein the first component and the second component are accommodated within an open cavity.
Figure 4B:
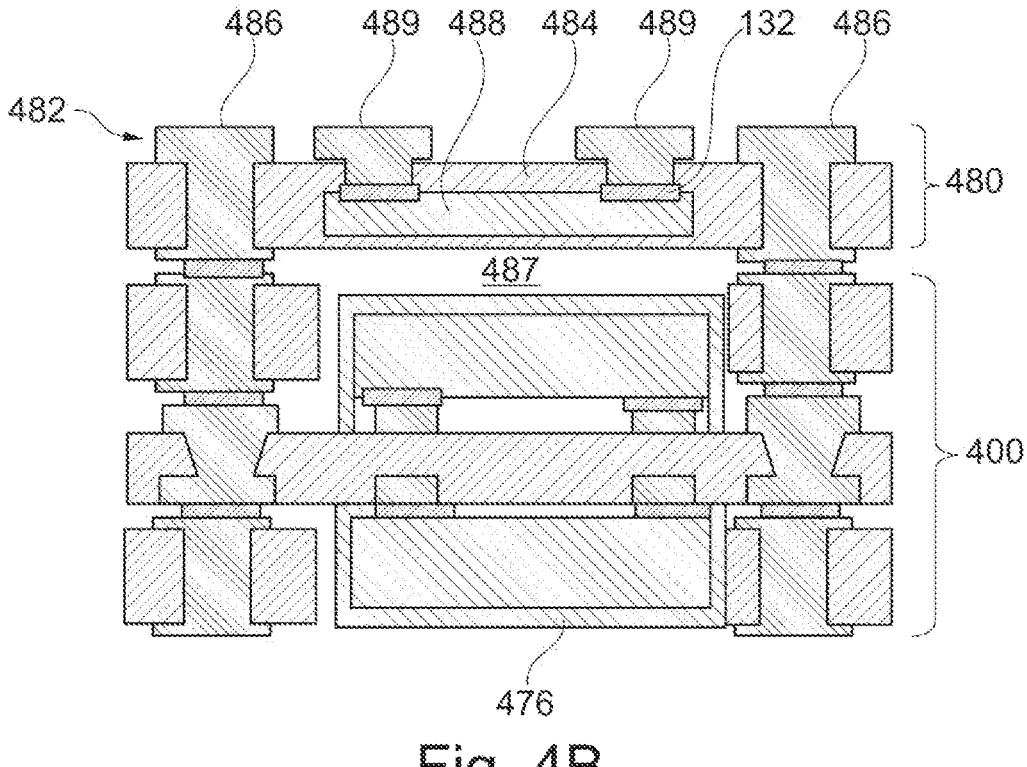

FIG. 4A and FIG. 4B show electronic packages 400 wherein the first component 130a and the second component 130b are accommodated within an open cavity 475.

As can best be seen from FIG. 4A, by contrast to the embodiments elucidated above, there is not provided a filler material, neither a first filler material nor a second filler material. Hence, the open cavity 475 comprises a plurality of voids 477. In order to protect the first component 130a and the second component 130b from undesired environmental perturbations reaching the components 130a, 130b via these voids 477 there are provided two component covers 476 shielding respectively one component 130a or 130b from environmental impacts. The component covers 476 may be made or may comprise any suitable coating material, for instance from a polymer material such as PTFE and/or from a thermal conductive material such as copper, graphene, etc. In other embodiments the component covers 476 represents a protection layer which comprises or which is made from electrically and thermal conductive materials (e.g., copper, graphene) or hydrophobic materials, e.g., PTFE, as a moisture protective layer.

This approach, which works without any filler material, may result in a significant reduction of mechanical stress. Further, thermal conduction towards a neighboring component can be blocked or can be reduced at least significantly. This holds true, in particular, for vertically neighboring components accommodated within stacked layer structures.

Such a vertically neighboring component is provided in the electronic package shown in FIG. 4B. In addition to the electronic package 400 this (extended) electronic package comprises a build-up structure 480 formed on top of the package 400. This build-up structure 480 comprises a patterned conductive layer 482, an insulating layer 484 and first frame through connections 486. The above-mentioned vertically neighboring component is embedded within the insulating layer 484 and is denominated with reference numeral 488.

Electric connections 489 are formed within the insulating layer 484 in order to electrically connect connection terminals 132 of the embedded component 488 from the upper side. In some RF applications the electric connections 489 may be used as antenna elements.

As can be seen from FIG. 4B, there is formed a comparatively large air gap or gas gap 487 below the embedded component 488 respectively below the build-up structure 480. As has already mentioned above, this air/gas gap 487 forms a thermal barrier between the embedded component 488 and the middle component located below the component 488.

Figures 5A, 5B, 5C:
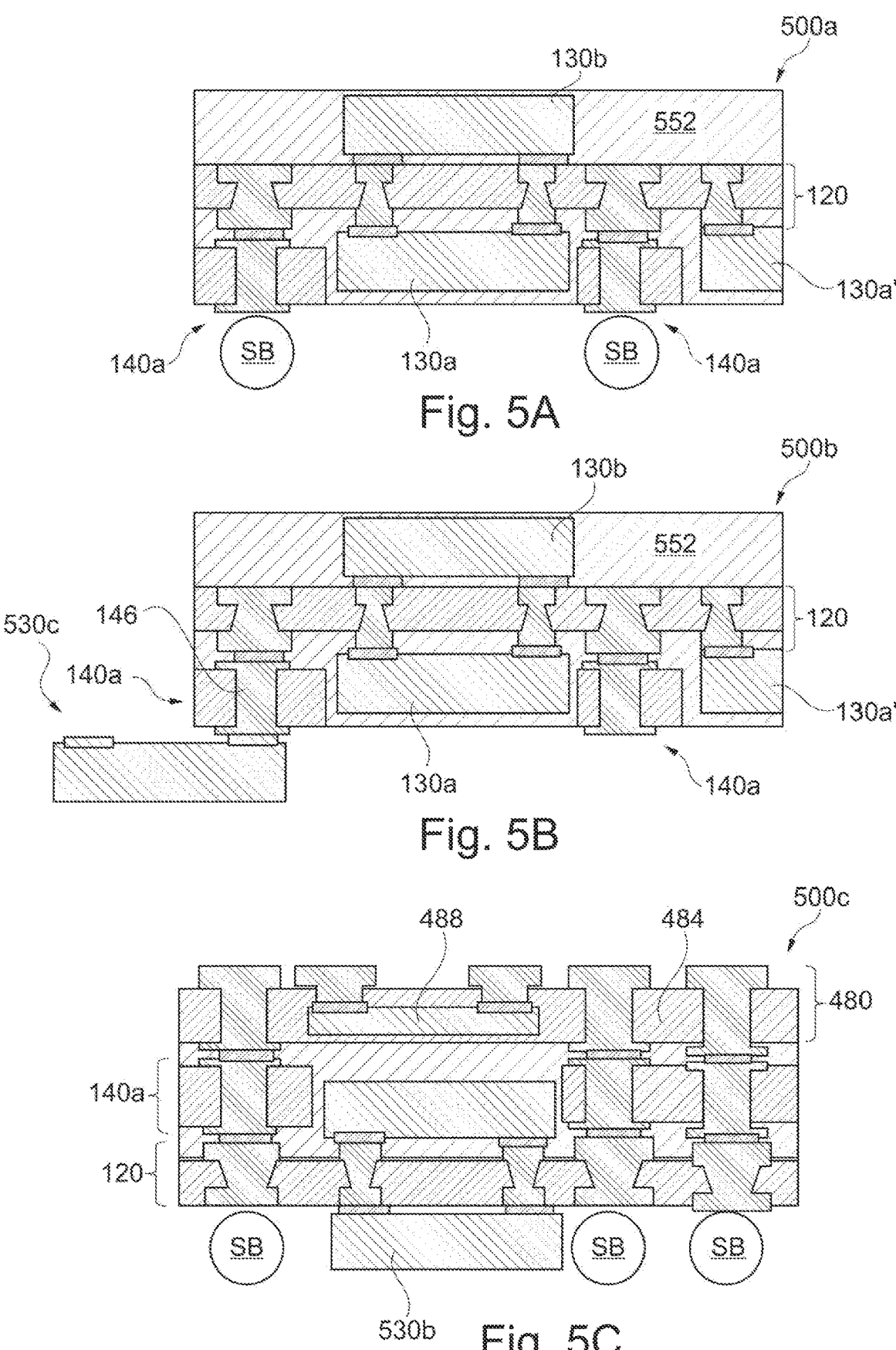
FIG. 5A, FIG. 5B, FIG. 5C, FIG. 5D, and FIG. 5E show various electronic packages in accordance with embodiments of the invention.
Figure 5D:
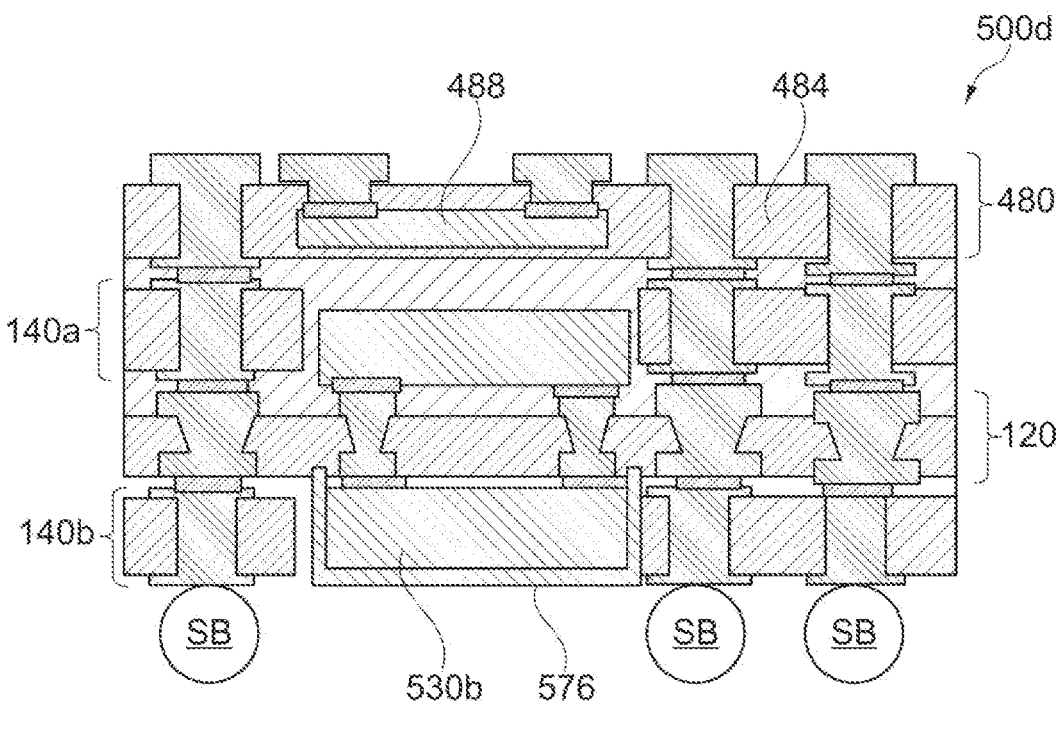
Figure 5E:
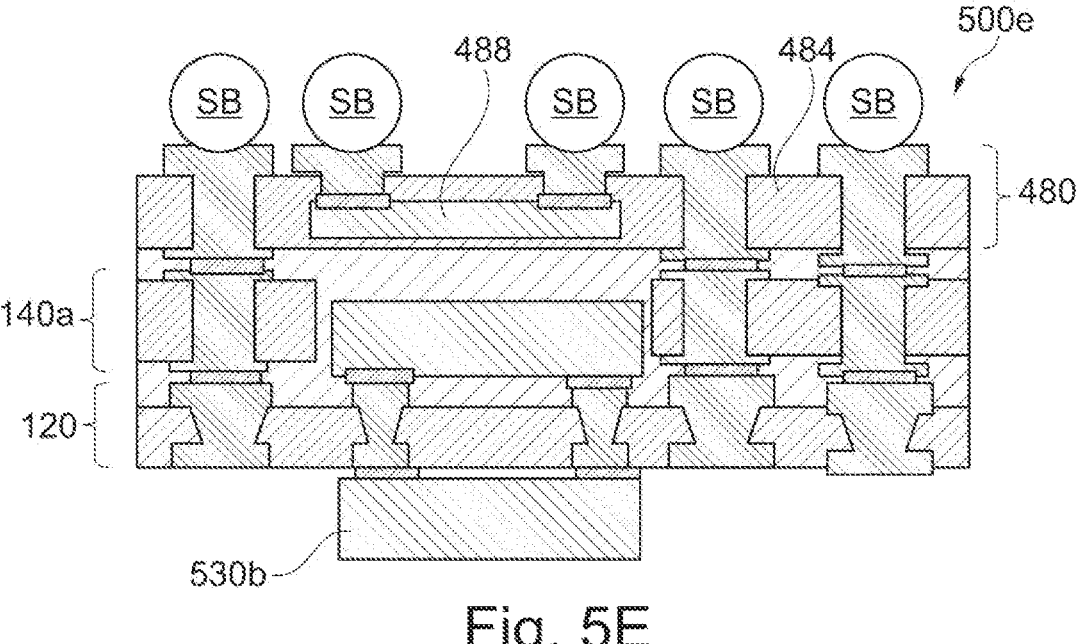

FIG. 5A through to FIG. 5E show various electronic packages in accordance with embodiments of the invention which are provided with solder ball terminals for an electrical connection with a not depicted main component carrier, e.g., a motherboard.

FIG. 5A shows an electronic package 500a which comprises solder balls SB at its bottom side. Specifically, the solder balls SB electrically connect with vertical connection structures formed within the first frame structure 140a, which in accordance with the embodiments presented above surrounds the first component 130a.

In the electronic package 500a the second component 130b is not surrounded by a frame structure. Instead, there is provided a bulk filler material 552 surrounding and protecting the second component 130b.

FIG. 5B shows an electronic package 500b comprising a third component 530c. This third component 530c is electrically connected with a first frame through connection 146 of the first frame structure 140a.

It is mentioned that the electronic package comprises a not depicted structure which surrounds at least partially the third component in order to provide for a mechanic stability. This surrounding structure may be a known mold or a layer build-up, preferably with an appropriate filling material in order to stabilize the third component 530c in a smooth manner.

FIG. 5C shows an electronic package 500c wherein the second component 530b is not surrounded by a frame structure. Instead, the second component 530b is mounted respectively suspended at the bottom side of the layer stack 120 in between solder balls SB.

FIG. 5D shows an electronic package 500d wherein compared to the package 500c the second component 530b is protected with a component cover 576. The component cover 576 may be made from the same coating materials as the component cover respectively the coating material 476 of the electronic package 400. It is mentioned that in the exemplary embodiment shown here, not all embedded components have the same height.

FIG. 5E shows an electronic package 500e wherein again the second component 530b is not surrounded by a frame structure. By contrast to the electronic package 500c, the solder balls SB are provided at the upper side. Further, the number of the solder balls SB is five (instead of three).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

LIST OF REFERENCE SIGNS

100 electronic package
110a temporary carrier
110b further temporary carrier
110c temporary carrier
120 layer stack
122 (patterned) electrically conductive layer structure
124 electrically insulating layer structure
126 layer stack through connections
128 electric interface
130a first component
130a' further first component
130b second component
130b' further second component
130c third component
130c' further third component
132 connection terminal
140a first frame structure
140a' further first frame structure
140b second frame structure
140b' further second frame structure
140c third frame structure
140c' further third frame structure
142 (patterned) conductive layer
144 insulating layer
146 first frame through connections/metallized via
148 opening
150a first filler material
150b second filler material
160 further layer stack
162 (patterned) electrically conductive layer structure
164 electrically insulating layer structure
166 layer stack through connections
200a stacked electronic package
200b singularized stacked electronic package
200c shielded singularized stacked electronic package
270 additional layer stack
272 connection pad/antenna element
274 shielding layer
300 stacked electronic package
349 inner frame region
370 additional layer stack
400 electronic package
475 open cavity
476 component cover/coating material/protection layer
477 voids
480 build-up structure
482 (patterned) conductive layer
484 insulating layer
486 first frame through connections/metallized via
487 air gap/gas gap
488 embedded component
489 electric connection/antenna element
500a-e electronic package
530b second component
530c third component
552 bulk filler material
576 component cover/coating material
SB solder ball

The invention claimed is:

1. A method for manufacturing an electronic package, the method comprising:

providing a temporary carrier;

forming a layer stack comprising at least one electrically insulating layer structure and at least one patterned electrically conductive layer structure on the temporary carrier, wherein the layer stack comprises a lower surface adjoining the temporary carrier and an upper surface opposite to the lower surface, a plurality of layer stack through connections extending from the upper surface of the layer stack to the lower surface of the layer stack, wherein the layer stack through connections are spatially arranged with a layer stack density;

mounting a first component at the upper surface of the layer stack;

placing a first frame structure at the upper surface of the layer stack, the first frame structure surrounding at least partially the first component, the first frame structure including a plurality of first frame through connections spatially arranged with a first density being smaller than the layer stack density;

covering the first component with a first coating material, the first coating material spatially extending at least partially into voids defined by the first frame structure as well as into voids defined by the layer stack; and removing the temporary carrier from the layer stack;

wherein the lower surface of the layer stack is an even surface and the opposite upper surface of the layer stack is an uneven surface;

mounting a second component at the lower surface of the layer stack;

placing a second frame structure placed at the lower surface of the layer stack, the second frame structure surrounding at least partially the second component, wherein the second frame structure comprises a plurality of second frame through connections extending through the second frame structure, wherein the second frame through connections are spatially arranged with a second density being smaller than the layer stack density and/or wherein the second component is accommodated within a cavity defined at least partially by the second frame structure; and filling the cavity at least partially with a second filler material.

2. The method as set forth in claim 1, wherein the first coating material is a first filler material, which monolithically fills at least partially communicating voids existing between the first component and the first frame structure and which extends into the layer stack.

3. The method as set forth in claim 1, further comprising:

after covering the first component with the first coating material and before mounting the second component, attaching a further temporary carrier at an upper surface of the first component and/or at an upper surface of the first frame structure; and after mounting the second component, removing the further temporary carrier.

4. The method as set forth in claim 1, further comprising:

planarizing the upper surface of the first component and the upper surface of the first frame structure; and/or planarizing the lower surface of the second component and the lower surface of the second frame structure.

5. The method as set forth in claim 1, further comprising:

mounting a further first component at the upper surface of the layer stack;

placing a further first frame structure at the upper surface of the layer stack, the further first frame structure surrounding at least partially the further first component;

mounting a further second component at the lower surface of the layer stack; and wherein the method further comprises placing a further second frame structure at the lower surface of the layer stack, the further second frame structure surrounding at least partially the further second component.

6. The method as set forth in claim 5, further comprising:

filling voids existing between the further first component and the further first frame structure with the first filler material; and/or filling voids existing between the further second component and the further second frame structure with the second filler material.

7. The method as set forth in claim 5: further comprising:

performing at least on singularization process, such that the manufactured electronic package is separated into at least (i) an individual electronic package comprising a portion of the layer stack, the first component, the second component, the first frame structure, and the second frame structure; and (ii) a further individual electronic package comprising a further portion of the layer stack, the further first component, the further second component, the further first frame structure, and the further second frame structure.

8. An electronic package, comprising:

a layer stack comprising at least one electrically insulating layer structure and at least one patterned electrically conductive layer structure forming at least partially a plurality of layer stack through connections extending from an upper surface of the layer stack to a lower surface of the layer stack, wherein the layer stack through connections are spatially arranged with a layer stack density;

a first component mounted at the upper surface of the layer stack; and a first frame structure placed at the upper surface of the layer stack, the first frame structure surrounding the first component, wherein the first frame structure comprises a plurality of first frame through connections extending through the first frame structure, wherein the first frame through connections are spatially arranged with a first density being smaller than the layer stack density;

wherein the first component is covered with a first coating material, which spatially extends at least partially into voids at or within the first frame structure as well as into voids at or within the layer stack; and wherein the lower surface of the layer stack is an even surface and the opposite upper surface of the layer stack is an uneven surface; and wherein the electronic package further comprises a second component mounted at the lower surface of the layer stack and a second frame structure placed at the lower surface of the layer stack, the second frame structure surrounding at least partially the second component, wherein the second frame structure comprises a plurality of second frame through connections extending through the second frame structure, wherein the second frame through connections are spatially arranged with a second density being smaller than the layer stack density and/or wherein the second component is accommodated within a cavity defined at least partially by the second frame structure, wherein the cavity is filled at least partially with a second filler material.

9. The electronic package as set forth in claim 8, wherein the density is a geometric property which relates to the spatial arrangement of the respective through connections within planes being parallel to the planar extension of the layers of the layer stack.

10. The electronic package as set forth in claim 8, further comprising:

an electric interface connecting at least one of the layer stack through connections with at least one of the first frame through connections.

11. The electronic package as set forth in claim 8, wherein the first component is surrounded by a first filler material forming a first protection layer and a region of a first cavity between the first component and the layer stack is a first void, wherein the first protection layer forms both a part of the layer stack and a part of the first frame structure; and/or wherein the second component is surrounded by a second filler material forming a second protection layer and a region of the second cavity between the second component and the layer stack is a second void.

12. The electronic package as set forth in claim 8, further comprising:

a further layer stack, which is formed at the first frame structure and which comprises at least one further electrically insulating layer structure and at least one further patterned electrically conductive layer structure forming at least partially a plurality of further layer stack through connections extending from an upper surface of the further layer stack to a lower surface of the further layer stack, wherein the further layer stack through connections are spatially arranged with a further layer stack density being higher than the first density.

13. The electronic package as set forth in claim 8, further comprising:

a third component mounted at the first frame structure and being electrically connected with a first frame through connection.

14. The electronic package as set forth in claim 8, wherein the second filler material forms both a part of the layer stack and a part of the second frame structure.

15. The electronic package as set forth in claim 8, wherein the layer stack through connections and/or the further layer stack through connections have a line spacing being smaller than 8 µm and the first frame through connections are arranged with a line spacing larger than 15 µm.

16. The electronic package as set forth in claim 8, further comprising:

a first build-up structure formed above the first component and the first frame structure and/or a second build-up structure formed below the second component and the second frame structure.

* * * * *